US012648134B2

(12) United States Patent
Chen et al.

(10) Patent No.:  US 12,648,134 B2
(45) Date of Patent:      Jun. 2, 2026

(54) SEMICONDUCTOR DEVICE INCLUDING MEMORY AND CAPACITOR

(71) Applicant: MACRONIX International Co., Ltd., Hsinchu (TW)

(72) Inventors: Wei Min Chen, Hsinchu County (TW); Wei Chun Tseng, Hsinchu City (TW); Lan Ting Huang, Hsinchu City (TW)

(73) Assignee: MACRONIX International Co., Ltd., Hsinchu (TW)

( * ) Notice: Subject to any disclaimer, the term of this patent is extended or adjusted under 35 U.S.C. 154(b) by 425 days.

(21) Appl. No.: 18/475,242

(22) Filed: Sep. 27, 2023

(65) Prior Publication Data

US 2025/0107077 A1      Mar. 27, 2025

(51) Int. Cl.
H10B 41/20          (2023.01)
H10B 41/35          (2023.01)
H10B 41/40          (2023.01)
H10B 43/20          (2023.01)
H10B 43/35          (2023.01)
H10B 43/40          (2023.01)

(52) U.S. Cl.
CPC ............. H10B 41/20 (2023.02); H10B 41/40 (2023.02); H10B 43/20 (2023.02); H10B 43/40 (2023.02); H10B 41/35 (2023.02); H10B 43/35 (2023.02)

(58) Field of Classification Search
CPC ........ H10B 41/20; H10B 43/20; H10B 41/40; H10B 43/40; H10B 41/35; H10B 43/35; H10B 12/033

USPC .......................................................... 257/314
See application file for complete search history.

(56)                  References Cited

U.S. PATENT DOCUMENTS

2004/0113190 A1      6/2004   Oh et al.
2020/0194448 A1 *    6/2020   Kim ........................ H10B 43/10
2024/0049471 A1 *    2/2024   Kang ...................... H10B 41/50

FOREIGN PATENT DOCUMENTS

TW            201142869            12/2011

OTHER PUBLICATIONS

"Office action of Taiwan Counterpart Application ," issued on Sep. 23, 2024, p. 1-p. 5, in which the listed reference was/references were cited.

* cited by examiner

*Primary Examiner* — Nduka E Ojeh
(74) *Attorney, Agent, or Firm* — J.C. PATENTS

(57)                  ABSTRACT

A semiconductor device includes a substrate, a plurality of memory arrays and a plurality of capacitors. The substrate includes a plurality of memory array regions. Each memory array region includes a plurality of memory blocks and a plurality of dummy blocks. The dummy blocks are located along a boundary of the memory blocks. The plurality of memory arrays are disposed in the plurality of memory blocks. The plurality of capacitors are disposed in the plurality of dummy blocks along the boundary of the plurality of memory blocks. The plurality of memory arrays may include 3D NAND flash memories with high capacity and high performance.

20 Claims, 8 Drawing Sheets

R4

R4

SEMICONDUCTOR DEVICE INCLUDING MEMORY AND CAPACITOR

BACKGROUND

Technical Field

Embodiments of the present disclosure are related to an integrated circuit, and particularly to a semiconductor device including a memory and a capacitor.

Description of Related Art

A non-volatile memory device (e.g., a flash memory) has the advantage that stored data does not disappear at power-off, so it becomes a widely used memory device for a personal computer or other electronic equipment.

Currently, the flash memory arrays commonly used in the industry include a NOR flash memory and a NAND flash memory. The NAND flash memory has multiple memory cells connected in series, so the NAND flash memory has better integration and area utilization than the NOR flash memory, and has been widely used in various electronic products. In addition, in order to further enhance the integration of memory devices, a 3-dimensional NAND flash memory has been developed. However, there are still many challenges associated with a 3-dimensional NAND flash memory. For example, the existing 3-dimensional NAND flash memory chip has capacitors therein, but the capacitors occupy the space of the existing peripheral circuit region.

SUMMARY

The present disclosure provides a semiconductor device, in which capacitors are disposed without increasing the area.

This embodiment of the present disclosure provides a semiconductor device, which includes a substrate, a plurality of memory arrays and a plurality of capacitors. The substrate includes a plurality of memory array regions. Each of the memory array regions includes a plurality of memory blocks and a plurality of dummy blocks. The dummy blocks are located along a boundary of the memory blocks. The plurality of memory arrays are disposed in the memory blocks. The plurality of capacitors are disposed in the dummy blocks along the boundary of the memory blocks.

An embodiment of the present disclosure provides a semiconductor device, which includes a substrate, a stacked structure, a plurality of memory arrays, and a plurality of capacitors. The stacked structure is disposed over the substrate. The stacked structure includes a plurality of insulating layers and a plurality of conductive layers stacked alternately with each other. The plurality of memory arrays are disposed in the stacked structure. The plurality of capacitors are disposed in the stacked structure and adjacent to the memory arrays.

Based on the above, in this embodiment of the present disclosure, capacitors are disposed in the stacked structure in the dummy blocks, rather than in the peripheral circuit region, nor in the memory blocks. The capacitors of the present disclosure do not occupy the areas of the peripheral circuit region and the memory regions, so that the chip area can be saved.

DESCRIPTION OF THE EMBODIMENTS

Figure 1A:
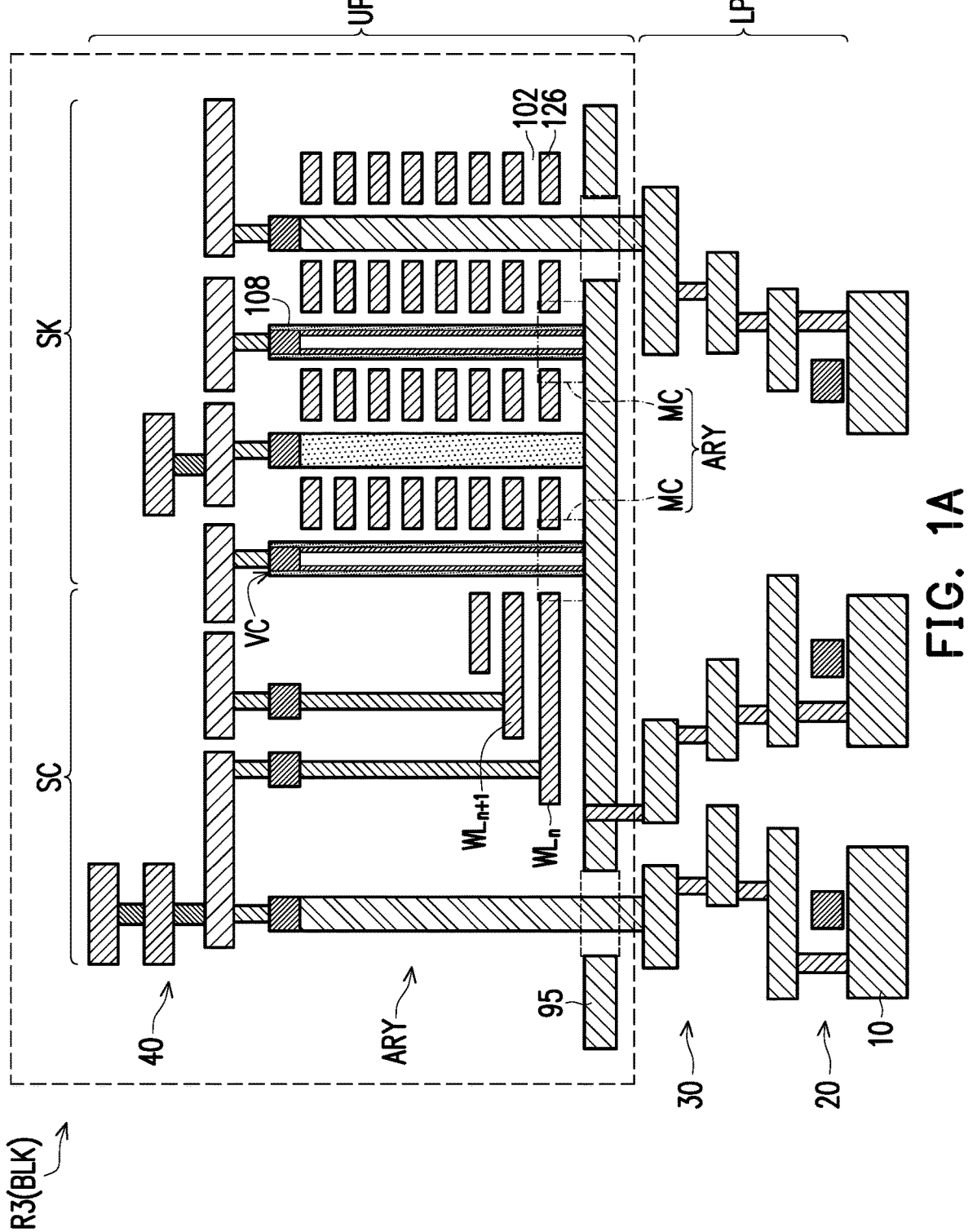
FIG. 1A is a schematic cross-sectional view of a semiconductor device with a complementary metal-oxide-semiconductor device under a memory array (CMOS-Under-Array, CUA) structure in a memory block according to an embodiment of the present disclosure.
Figure 1B:
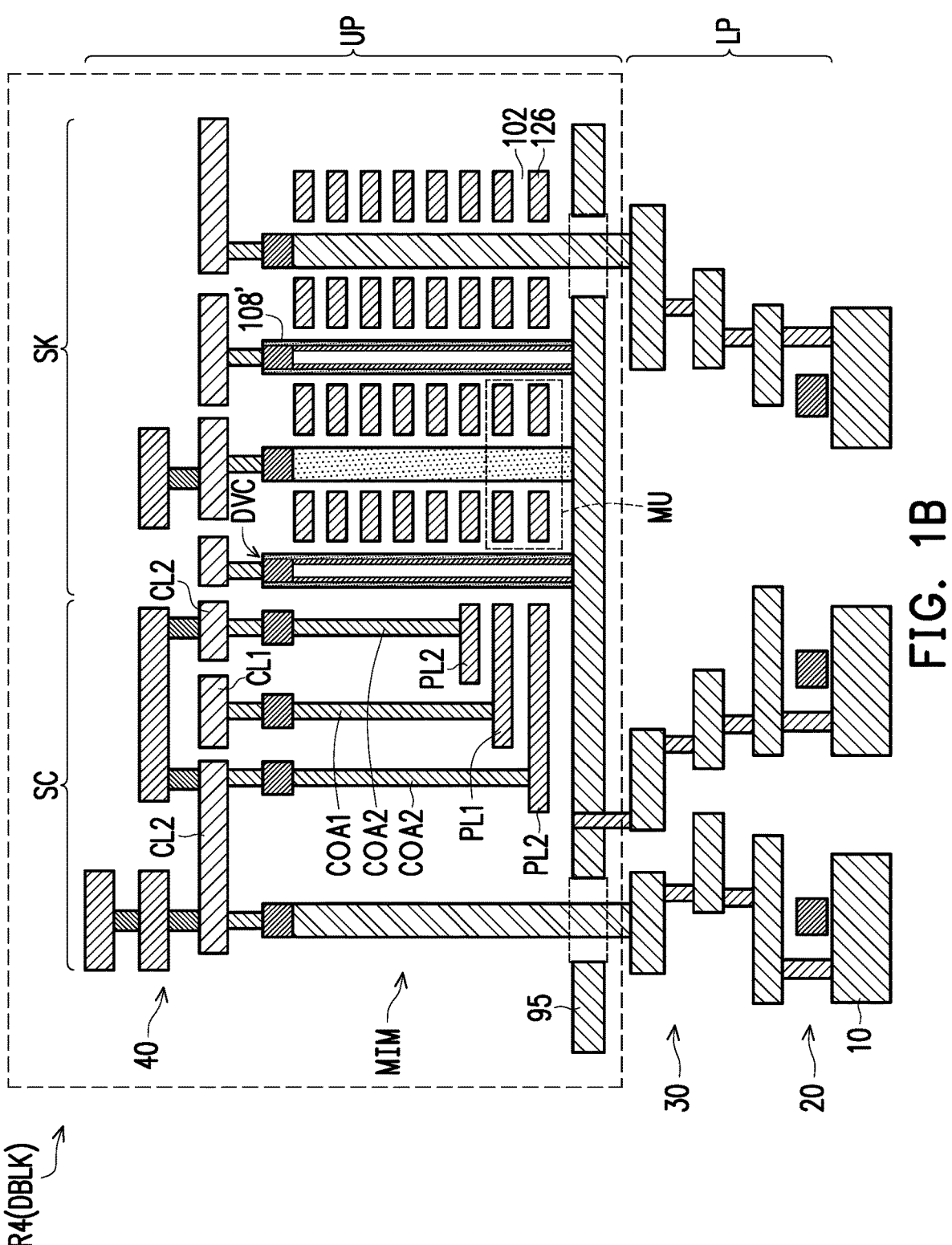
FIG. 1B is a schematic cross-sectional view of a semiconductor device with a CUA structure in a dummy block according to an embodiment of the present disclosure.

FIG. 1A is a schematic cross-sectional view of a semiconductor device with a CMOS-Under-Array (CUA) structure in a memory block according to an embodiment of the present disclosure. FIG. 1B is a schematic cross-sectional view of a semiconductor device with a CUA structure in a dummy block according to an embodiment of the present disclosure.

Referring to FIG. 1A, the semiconductor device in this embodiment of the present disclosure is a complementary metal-oxide-semiconductor device under a memory array (CUA) structure. The CUA structure includes a substrate 10, a lower part LP and an upper part UP. The lower layer LP is formed over the substrate 10, and the upper layer UP is formed over the lower layer LP.

Figure 2A:
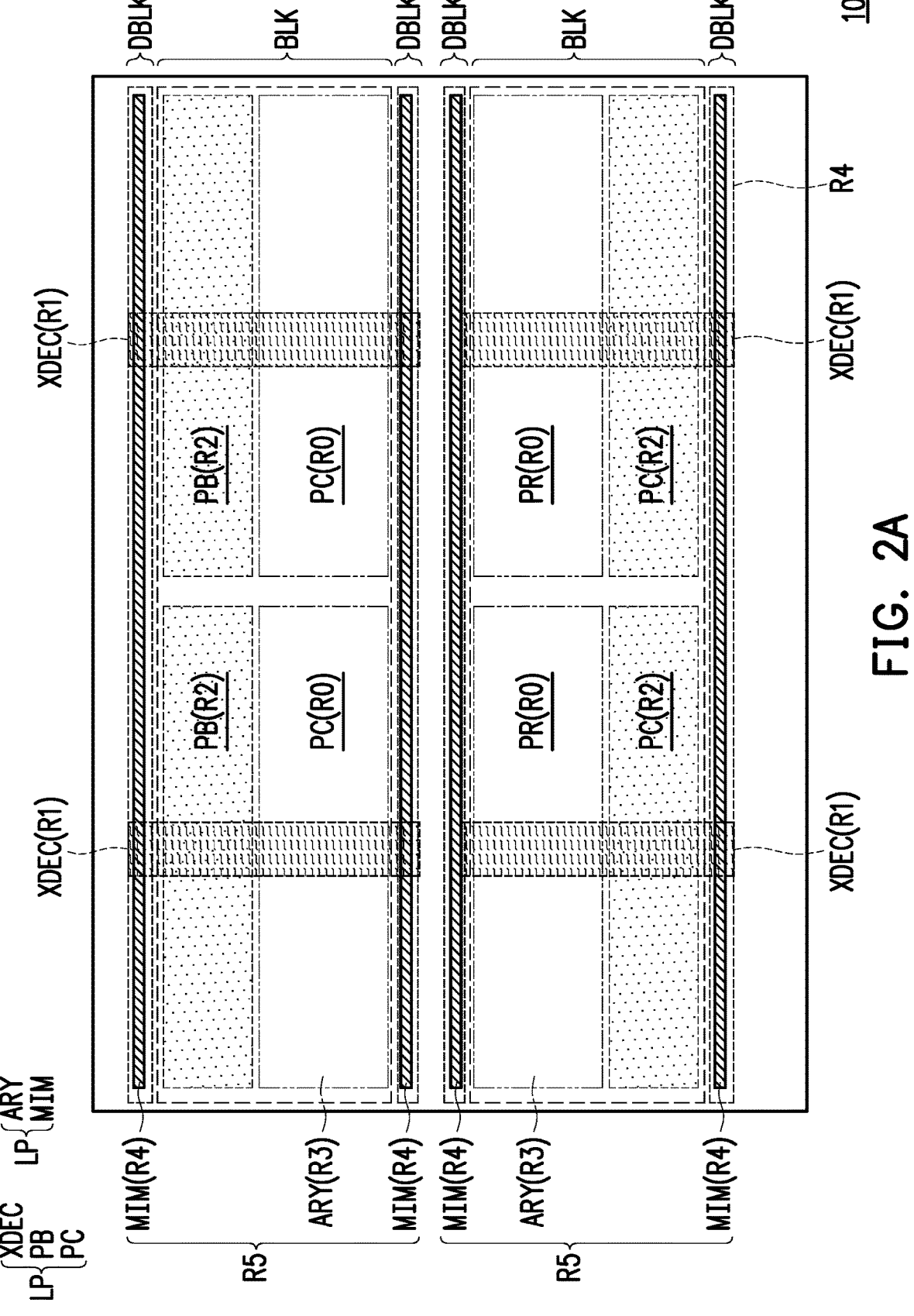
FIG. 2A is a top view of the layout of a semiconductor device according to an embodiment of the present disclosure.
Figure 3A:
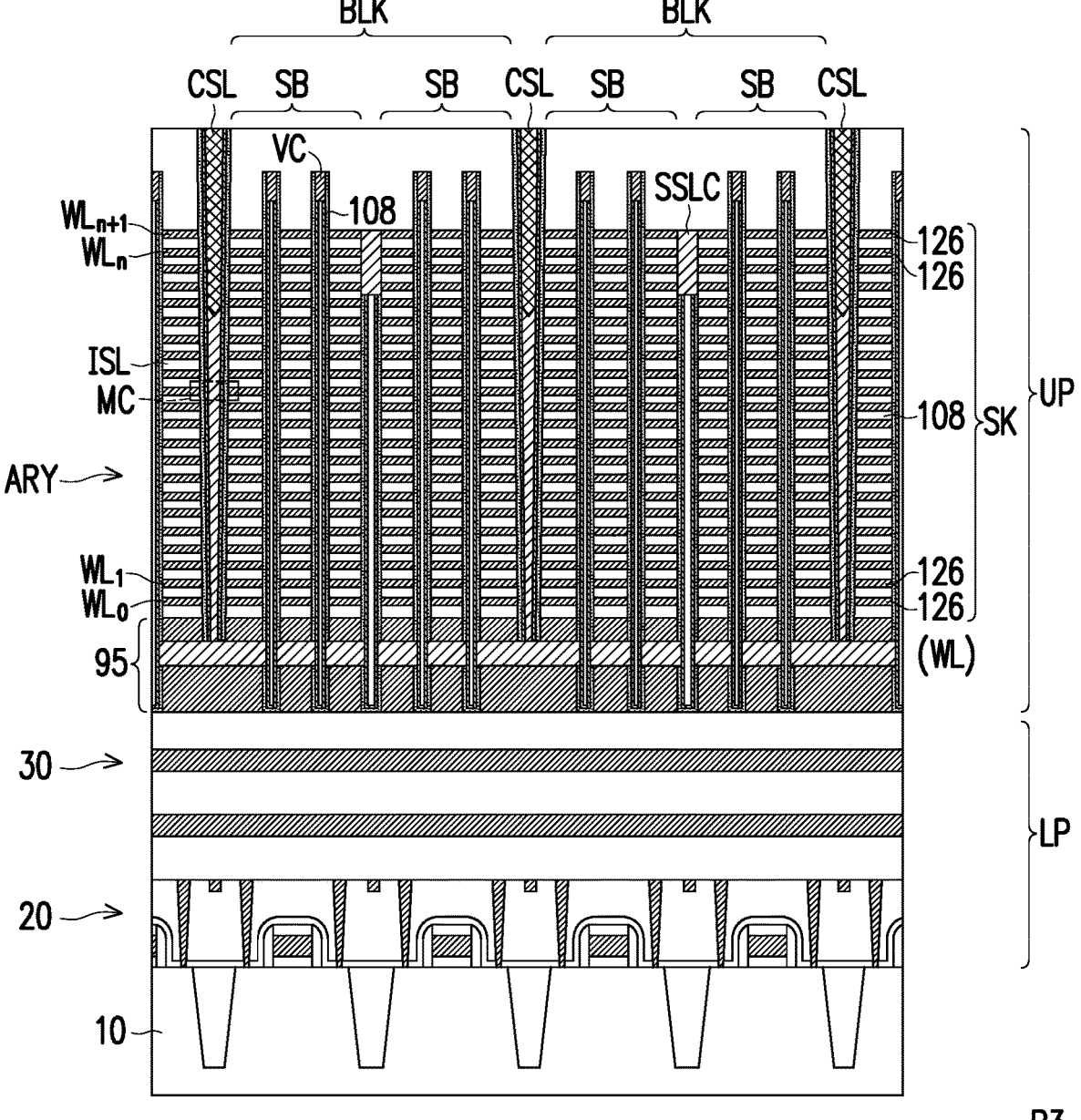
FIG. 3A is a partial schematic cross-sectional view of a semiconductor device in a memory block according to an embodiment of the present disclosure.

The substrate 10 may be a semiconductor substrate, such as a silicon-containing substrate. The lower layer LP may include a device layer 20 and an interconnect structure 30. The device layer 20 may include an active device or a passive device. The active device may include a transistor, a diode, or the like. The passive device may include a capacitor, an inductor, or the like. The transistor may include an N-type metal oxide half (NMOS) transistor, a P-type metal oxide half (PMOS) transistor, or a complementary metal oxide half element (CMOS). The device layer 20 may include multiple peripheral circuits PR, multiple column decoders and row decoders XDEC, and multiple page buffers PB (as shown in FIG. 2A). The upper part UP includes a stop structure 95, a stacked structure SK, a staircase structure SC, and an interconnect structure 40. The stop structure 95 may have a single-layer or a multi-layer semiconductor structure (as shown in FIG. 3A). The stop structure 95 may serve as a source line, and may be referred to as a common source conductive layer. The stacked structure SK includes multiple conductive layers 126 and multiple insulating layers 102 alternately stacked. The material of conductive layers 126 includes tungsten. The material of insulating layers 102 includes silicon oxide. The stacked structure SK has multiple memory array ARY including multiple memory cells MC.

Referring to FIG. 1B, the upper part UP of the CUA structure in this embodiment of the present disclosure further includes multiple capacitors MIM. The multiple capacitors MIM are also disposed in the stacked structure SK. The multiple capacitors MIM and the multiple memory arrays ARY are disposed in the same upper part UP, and therefore, the multiple capacitors MIM and the multiple memory arrays ARY have the same height and are laterally adjacent to each other.

Figure 2B:
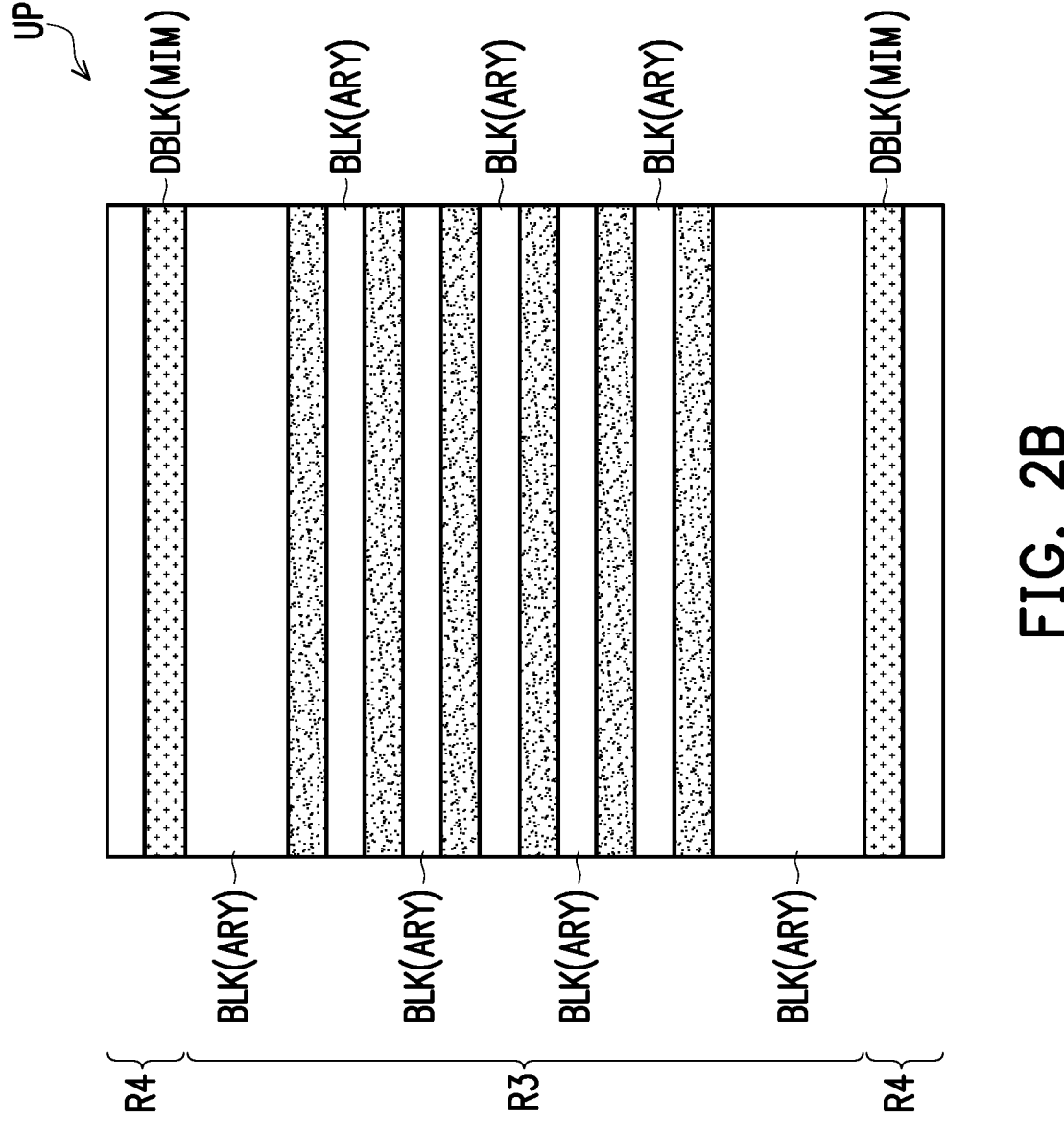
FIG. 2B is a top view of a memory array region having multiple memory blocks and multiple dummy blocks according to an embodiment of the present disclosure.
Figure 2C:
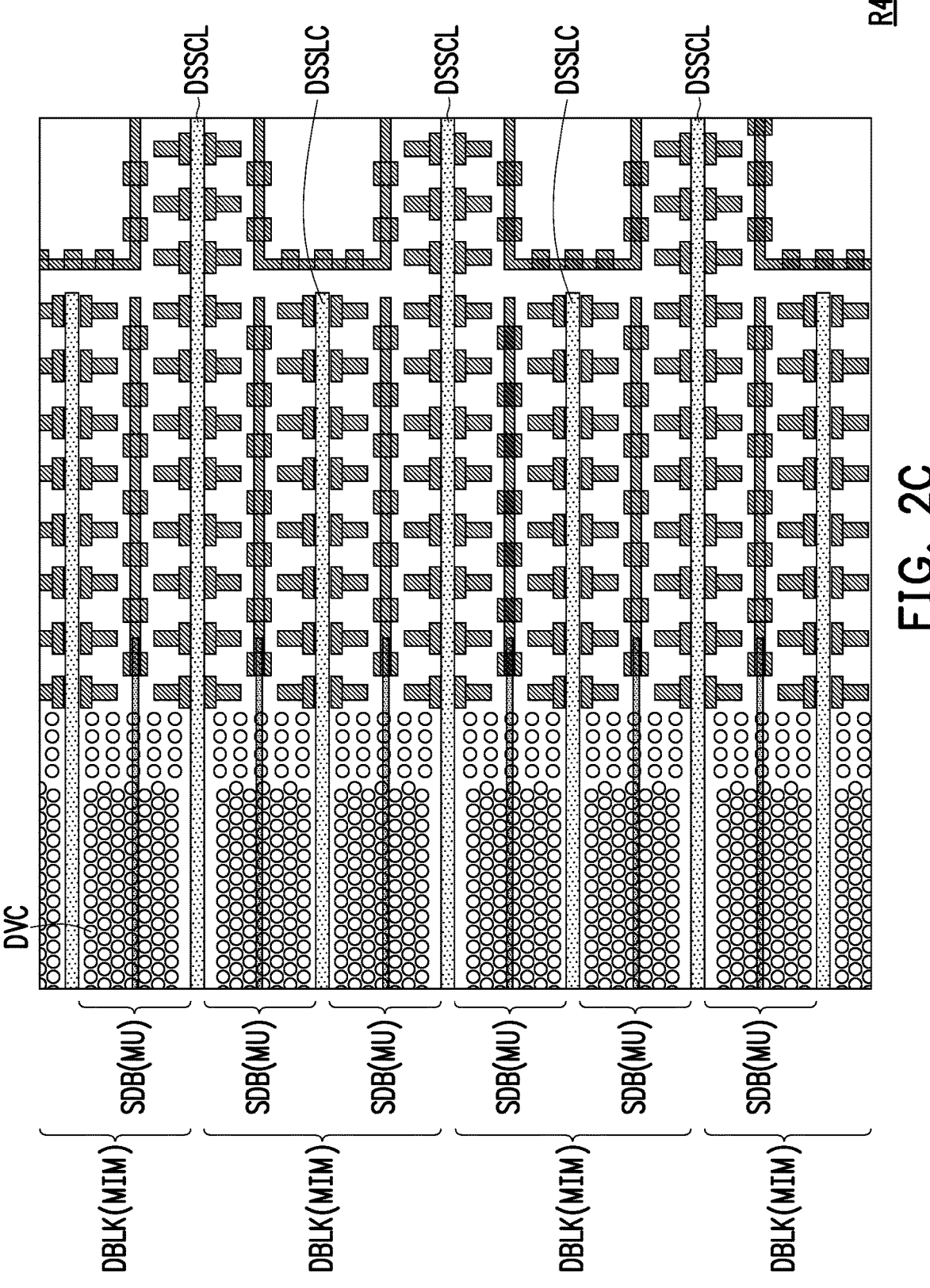
FIG. 2C is a top view of multiple dummy blocks according to an embodiment of the present disclosure.

FIG. 2A is a top view of the layout of a semiconductor device according to an embodiment of the present disclosure. FIG. 2B is a top view of a memory array region with multiple memory blocks and multiple dummy blocks according to an embodiment of the present disclosure. FIG. 2C is a top view of multiple dummy blocks according to an embodiment of the present disclosure.

Referring to FIG. 2A, from a top view, multiple peripheral circuits PR, multiple column decoders and row decoders XDEC and multiple page buffers PB of the semiconductor device are respectively provided in regions R0, regions R1 and regions R2 of the lower part LP (or referred to as regions R0, regions R1 and regions R2 of the substrate 10). The memory arrays ARY are disposed in the regions R3 of the upper part UP (or referred to as regions R3 of the substrate 10). The multiple capacitors MIM are disposed in regions R4 of the upper part UP (or referred to as regions R4 of the substrate 10).

Referring to FIG. 2A and FIG. 2B, the upper part UP includes multiple memory array regions R5 (or referred to as multiple regions R5 of the substrate 10). Each memory array region R5 includes a region R3 and a region R4. The region R4 is located along the boundary or at two sides of the region R3. The region R3 has multiple memory blocks BLK. The region R4 has multiple dummy blocks DBLK. The dummy blocks DBLK are along the boundary of the multiple memory blocks BLK. For example, the dummy blocks DBLK are located at two sides of the multiple memory blocks BLK. Since the multiple capacitors MIM are not disposed in the regions R0, R1 or R2 of the lower part LP, they do not occupy the area of the regions R2 (or referred to as the peripheral circuit regions) configured to form the multiple peripheral circuits PR. The multiple capacitors MIM are disposed in the regions R4 of the upper part UP, and memory cells are originally not disposed in the regions R4. Therefore, the multiple capacitors MIM do not occupy the area of the memory blocks BLK configured to form the memory cells. In other words, this embodiment of the present disclosure uses stacked structure SK in dummy blocks DBLK (without functional devices or circuits) to form multiple capacitors MIM.

Figure 3B:
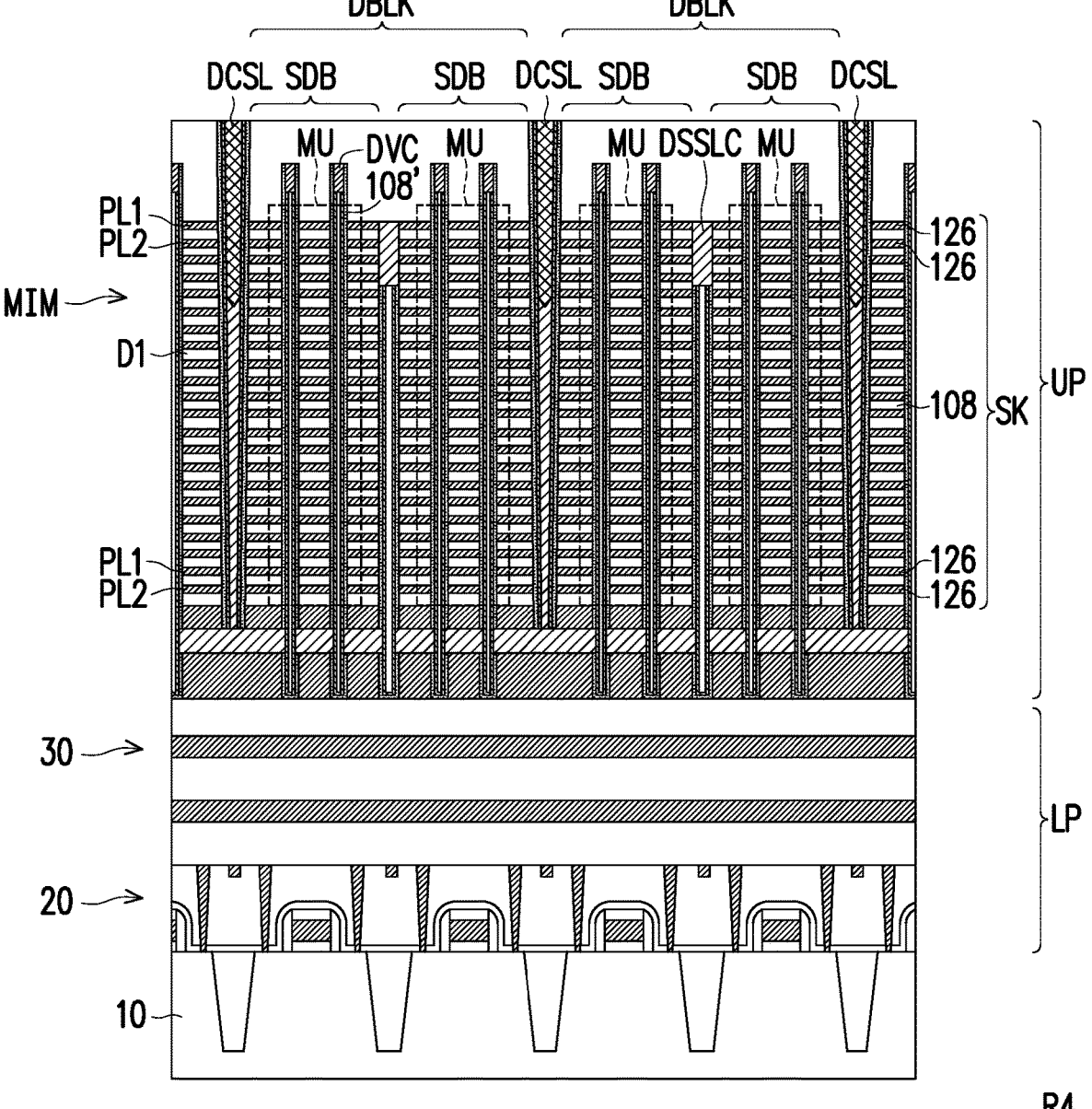
FIG. 3B is a partial schematic cross-sectional view of a semiconductor device in a dummy block according to an embodiment of the present disclosure.

FIG. 3A is a partial schematic cross-sectional view of a semiconductor device in a memory block according to an embodiment of the present disclosure. FIG. 3B is a partial cross-sectional schematic view of a semiconductor device in a dummy block according to an embodiment of the present disclosure.

Referring to FIG. 3A and FIG. 3B, multiple memory arrays ARY and multiple capacitors MIM in this embodiment of the present disclosure are all disposed in the stacked structure SK. The stacked structure SK is divided into multiple memory blocks BLK by multiple common source lines CSL, and is divided into multiple dummy blocks DBLK by multiple dummy common source lines DCSL. Each memory block BLK is divided into multiple sub-blocks SB by select source line cutting walls SSLC, and each dummy block DBLK is divided into multiple dummy sub-blocks SDB by dummy select source line cutting walls DSSLC.

The multiple memory arrays ARY are disposed in the multiple memory blocks BLK or the multiple sub-blocks SB. The multiple capacitors MIM are disposed in the multiple dummy blocks DBLK or the multiple dummy sub-blocks SDB. The multiple components of the dummy blocks DBLK may be the same or similar to the multiple components of the memory blocks BLK, but the capacitors MIM (rather than the memory cells MC) are disposed in the dummy blocks DBLK.

More specifically, as shown in FIG. 3A, multiple vertical channels VC, multiple charge storage structures 108, multiple common source lines CSL, and multiple select source line cutting walls SSLC extend through the stacked structure SK in the memory blocks BLK. Multiple conductive layers 126 of the stacked structure SK serve as multiple word lines WL. The charge storage structures 108 are arranged between the word lines WL and the vertical channel pillars VC, and multiple memory cells MC are formed at intersections between them. Therefore, there are multiple memory arrays ARY including multiple memory cells MC in the stacked structure SK.

Referring to FIG. 3B, multiple dummy vertical channel pillars DVC, multiple dummy charge storage structures 108', multiple dummy common source lines DCSL, and multiple dummy select source line cutting walls DSSLC penetrate through the stacked structure SK in the multiple dummy blocks DBLK. Multiple conductive layers 126 in the stacked structure SK serve as first electrode plates PL1 and the second electrode plates PL2 of the capacitors MIM. Multiple insulating layers 102 in the stacked structure SK serve as multiple dielectric layers D1 of the capacitors MIM. The dummy charge storage structures 108' are disposed between the first electrode plates PL1 and the dummy vertical channel pillars DVC, and are disposed between the second electrode plates PL2 and the dummy vertical channel pillars DVC; however, no memory cell MC is formed at intersections between them.

Referring to FIG. 2A and FIG. 2C, multiple memory arrays ARY are disposed in the stacked structure SK in the multiple memory blocks BLK of the region R3. Multiple capacitors MIM are disposed in the stacked structure SK in the dummy blocks DBLK. The capacitors MIM are laterally adjacent to the memory arrays ARY. In this embodiment, as shown in FIG. 2A, multiple dummy blocks DBLK (e.g., two dummy blocks DBLK) located between the memory blocks BLK in two adjacent memory array regions R3 are adjacent to each other, and multiple capacitors MIM (e.g., two capacitors MIM) located in the adjacent dummy blocks DBLK are adjacent to each other.

Referring to FIG. 2C, dummy blocks DBLK may include multiple dummy sub-blocks SDB. In this embodiment of the present disclosure, multiple capacitors MIM are disposed in the multiple sub-blocks SDB of the dummy blocks DBLK. Each capacitor MIM may be composed by a single capacitor cell MU or multiple capacitor cells MU. A single capacitor unit MU or multiple capacitor cell MU units can be disposed in each dummy blocks DBLK. As shown in the embodiment of FIG. 2C, a single capacitor cell MU is provided in each dummy sub-block SDB, and two capacitor cells MU in two dummy sub-blocks SDB of each dummy block DBLK form a capacitor MIM. However, the present disclosure is not limited thereto. Multiple capacitor cells MU in the same dummy block DBLK or dummy sub-block SDB can be connected in parallel or in series to form a single capacitor MIM or multiple capacitors MIM. Multiple capacitor cells MU in different dummy blocks DBLK can also be connected in parallel or in series to form a single capacitor MIM or multiple capacitors MIM. In other words, the present disclosure can design capacitors with various capacitances, and therefore provide extremely flexibility in application.

For example, as shown in FIG. 3A, the memory array ARY includes multiple odd-numbered word lines $WL_{n+1}$, multiple even-numbered word lines $WL_n$, and multiple separation layers ISL that separate the odd-numbered word lines $WL_{n+1}$ and the even-numbered word lines $WL_n$ from each other. For example, as shown in FIG. 3B, the capacitor MIM includes multiple first electrode plates PL1, multiple second electrode plates PL2, and multiple dielectric layers D1. The multiple first electrode plate PL1 are electrically connected to each other. The multiple second electrode plates PL2 are electrically connected to each other. A dielectric layer D1 is sandwiched between the adjacent first electrode plate PL1 and the second electrode plate PL2. The heights of the multiple first electrode plates PL1 are, for example, the same as the heights of the multiple odd-numbered word lines $WL_{n+1}$. The heights of the multiple second electrode plates PL2 are, for example, the same as the heights of the multiple even-numbered word lines $WL_n$. The heights of the multiple dielectric layers D1 are, for example, the same as the heights of the multiple separation layers ISL. In some embodiments, a first part of multiple odd-numbered conductive layers 126 of the stacked structure SK serves as multiple first electrode plates PL1, a second part of multiple odd-numbered conductive layers 126 of the stacked structure SK serves as multiple odd-numbered word lines $WL_{n+1}$, and the odd-numbered conductive layers are electrically insulated from each other. Similarly, a first part of multiple even-numbered conductive layers 126 of the stacked structure SK serves as multiple second electrode plates PL2, a second art of multiple even-numbered conductive layers 126 of the stacked structure SK serves as multiple even-numbered word lines $WL_n$, and the even-numbered conductive layers are electrically insulated from each other. Similarly, a first part of the multiple insulating layers 102 of the stacked structure SK serves as multiple dielectric layers D1, and a second part of the multiple insulating layers 102 of the stacked structure SK serves as multiple separation layers ISL.

Figure 3C:
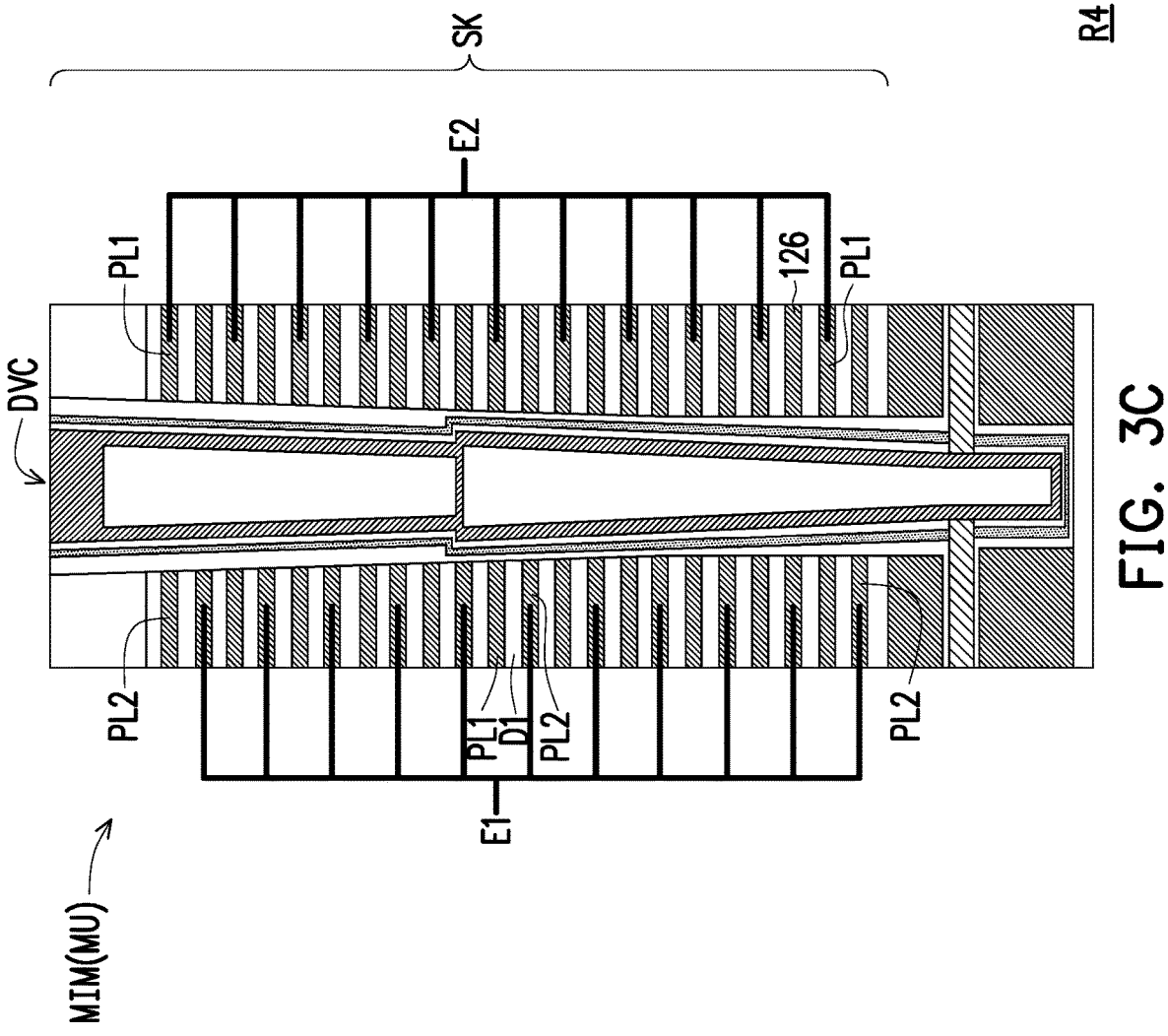
FIG. 3C is a schematic cross-sectional view of capacitors disposed in a dummy block according to an embodiment of the present disclosure.

FIG. 3C is a schematic cross-sectional view of a capacitor disposed in a dummy block according to an embodiment of the present disclosure.

Referring to FIG. 3C, the capacitor MIM or the capacitor cell MU includes multiple first electrode plates PL1, multiple second electrode plates PL2, and multiple dielectric layers D1. The multiple first electrode plate PL1 and the multiple second electrode plate PL2 are arranged alternately, and a dielectric layer D1 is disposed between adjacent first electrode plate PL1 and second electrode plate PL2. The multiple first electrode plates PL1 are electrically connected to a first terminal E1, and the multiple second electrode plates PL2 are electrically connected to a second terminal E2. In FIG. 3C, all the even-numbered conductive layers 126 and all the odd-numbered conductive layers 126 serve as a second electrode plate PL2 and a first electrode plate PL1 of a single capacitor MIM or a single capacitor cell MU, respectively. However, in other embodiments, a part of the even-numbered conductive layers 126 and a part of the odd-numbered conductive layers 126 in the stacked structure SK can serve as a second electrode plate PL2 and a first electrode plate PL1 of a single capacitor MIM or a single capacitor cell MU, respectively; another part of the even-numbered conductive layers 126 in the stacked structure SK and another part of the odd-numbered conductive layer 126 serve as a second electrode plate PL2 and a first electrode plate PL1 of another single capacitor MIM or another single capacitor cell MU, respectively.

Referring to FIG. 1B and FIG. 3C, the electrical relationship between multiple first electrode plates PL1 and multiple second electrode plates PL2 is described below. The multiple first electrode plates PL1 and the multiple second electrode plates PL2 at the ends of the staircase structure SC can be electrically connected to the upper conductive lines CL1 and CL2 through contacts COA1 and COA2, respectively. The conductive line CK1 can be connected to the first terminal E1 through other vias and conductive lines. The conductive line CL2 can be connected to the second terminal E2 through other vias and conductive lines. Since the stacked structure SK has a large number of conductive layers 126, the capacitor MIM or capacitor cell MU has a large number of first electrode plates PL1 and second electrode plates PL2. Therefore, the capacitor of the present disclosure has a large capacitance.

In this embodiment of the present disclosure, one or more capacitors are disposed in the upper part of the stacked structure in dummy blocks, rather than in the lower peripheral circuit region, nor in the upper memory blocks. The capacitors of the present disclosure do not occupy the areas of the peripheral circuit region and the memory region, so the chip area can be saved. Furthermore, since the stacked structure has a large number of conductive layers, the capacitors have a large number of first electrode plates and second electrode plates. Therefore, the capacitors of the present disclosure have large capacitances. In addition, the present disclosure can design capacitors with various capacitances, and therefore provide extremely flexibility in application.

What is claimed is:

1. A semiconductor device, comprising:
a substrate, comprising a plurality of memory array regions, wherein each of the memory array regions comprises a plurality of memory blocks and a plurality of dummy blocks, and the plurality of dummy blocks is located along a boundary of the plurality of memory blocks;
a plurality of memory arrays, disposed in the plurality of memory blocks; and
a plurality of capacitors, disposed in the plurality of dummy blocks along the boundary of the plurality of memory blocks,
wherein each of first electrode plates and second electrode plates of each of the plurality of capacitors and a corresponding word line in the memory array are composed of a same conductive layer.

2. The semiconductor device of claim 1, wherein the plurality of capacitors are laterally adjacent to the plurality of memory arrays.

3. The semiconductor device of claim 1, wherein the plurality of capacitors are respectively metal-insulator-metal (MIM) capacitors.

4. The semiconductor device of claim 1, wherein the memory arrays comprise a plurality of odd-numbered word lines, a plurality of even-numbered word lines, and a plurality of separation layers that separate the plurality of odd-numbered word lines and the plurality of even-numbered word lines from each other.

5. The semiconductor device of claim 4, wherein heights of the first electrode plates of the plurality of capacitors are the same as heights of the plurality of odd-numbered word lines, heights of the second electrode plates of the plurality of capacitors are the same as heights of the plurality of even-numbered word lines, and heights of a plurality of dielectric layers of the plurality of capacitor are the same as heights of the plurality of separation layers.

6. A semiconductor device of claim 5, further comprising:
a stacked structure disposed over the substrate in the plurality of memory array regions, wherein the stacked structure comprises a plurality of insulating layers and a plurality of conductive layers stacked alternately with each other,
wherein a first part of a plurality of odd-numbered conductive layers of the plurality of conductive layers serves as the first electrode plates, a second part of the plurality of odd-numbered conductive layers of the plurality of conductive layers serves as the plurality of odd-numbered word lines,
wherein a first part of a plurality of even-numbered conductive layers of the plurality of conductive layers serves as the second electrode plates, a second part of the plurality of even-numbered conductive layers of the plurality of conductive layers serves as the plurality of even-numbered word lines.

7. The semiconductor device of claim 1, further comprising an interconnect structure disposed over the substrate, wherein the plurality of memory arrays and the plurality of capacitors are disposed over the interconnect structure.

8. The semiconductor device of claim 1, wherein each of the plurality of dummy blocks comprises a plurality of dummy sub-blocks.

9. The semiconductor device of claim 8, wherein each of the plurality of capacitors comprises a plurality of capacitor cells located in the plurality of dummy sub-blocks.

10. The semiconductor device of claim 1, wherein the substrate comprises a plurality of memory peripheral regions adjacent to the plurality of memory array regions.

11. The semiconductor device of claim 10, wherein the plurality of capacitors do not occupy the plurality of memory blocks, and do not occupy the memory peripheral regions.

12. A semiconductor device of claim 1, wherein the plurality of dummy blocks between the plurality of memory blocks of the adjacent memory array regions are adjacent to each other, and the plurality of capacitors disposed in the adjacent dummy blocks are adjacent to each other.

13. A semiconductor device, comprising:
a substrate;
a stacked structure, disposed over the substrate, wherein the stacked structure comprises a plurality of insulating layers and a plurality of conductive layers stacked alternately with each other;
a plurality of memory arrays, disposed in the stacked structure; and
a plurality of capacitors, disposed in the stacked structure and adjacent to the plurality of memory arrays,

wherein each of first electrode plates and second electrode plates of each of the plurality of capacitors and a corresponding word line in the memory array are composed of a same conductive layer in the stacked structure.

14. The semiconductor device of claim 13, wherein the substrate comprises a first region and a plurality of second regions, and the first region is disposed between the plurality of second regions, and wherein the plurality of memory arrays are disposed in the stacked structure within the first region, and the plurality of capacitors are disposed in the stacked structure within the plurality of second regions.

15. The semiconductor device of claim 14, wherein the plurality of conductive layers located in the first region serve as a plurality of word lines of the plurality of memory arrays, and the plurality of conductive layers located in the plurality of second regions serve as the first electrode plates and the second electrode plates of the plurality of capacitors, and wherein the plurality of insulating layers located in the plurality of second regions serve as a plurality of dielectric layers of the plurality of capacitors, and each of the plurality of dielectric layers is sandwiched between the adjacent first electrode plate and the second electrode plate.

16. The semiconductor device of claim 15, wherein the first electrode plates are electrically connected to each other, and the second electrode plates are electrically connected to each other.

17. The semiconductor device of claim 15, wherein the of first electrode plates, the second electrode plates and the plurality of word lines are electrically insulated from each other.

18. The semiconductor device of claim 14, wherein the first region comprises a plurality of memory blocks, each of the plurality of second regions comprises dummy blocks, and the plurality of capacitors are disposed in the dummy blocks.

19. The semiconductor device of claim 15, further comprising:
a dummy channel pillar, extending through the first electrode plates, the second electrode plates and the plurality of dielectric layers; and
a dummy charge storage layer, disposed between the dummy channel pillar and the first electrode plates, and between the dummy channel pillar and the second electrode plates.

20. The semiconductor device of claim 13, further comprising an interconnect structure disposed between the plurality of capacitors and the substrate, and between the plurality of memory arrays and the substrate.

* * * * *